United States Patent
Huang et al.

(10) Patent No.: US 10,790,414 B2
(45) Date of Patent: Sep. 29, 2020

(54) LIGHT EMITTING DIODE

(71) Applicant: Au Optronics Corporation, Hsinchu (TW)

(72) Inventors: Pu-Jung Huang, New Taipei (TW); Pin-Miao Liu, Hsinchu County (TW); Cheng-Yeh Tsai, Taipei (TW); Chen-Chi Lin, Hsinchu County (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/414,791

(22) Filed: May 17, 2019

(65) Prior Publication Data

US 2019/0393382 A1 Dec. 26, 2019

(30) Foreign Application Priority Data

Jun. 20, 2018 (TW) .............................. 107121153 A

(51) Int. Cl.
*H01L 33/38* (2010.01)
*H01L 33/32* (2010.01)

(52) U.S. Cl.
CPC .............. *H01L 33/38* (2013.01); *H01L 33/32* (2013.01)

(58) Field of Classification Search
CPC ................................ H01L 33/38; H01L 33/32
USPC ........................................................... 257/79
See application file for complete search history.

(56) References Cited

U.S. PATENT DOCUMENTS

| 8,323,994 B2 | 12/2012 | Kamiya et al. |
| 2007/0145381 A1* | 6/2007 | Unno ................... H01L 33/145 257/79 |
| 2010/0012971 A1* | 1/2010 | Hiraoka ................ H01L 33/38 257/103 |
| 2010/0072508 A1 | 3/2010 | Kamiya et al. |
| 2017/0358711 A1 | 12/2017 | Aoyagi et al. |

FOREIGN PATENT DOCUMENTS

| CN | 1988195 | 6/2007 |
| CN | 101714599 | 5/2010 |
| CN | 102157657 | 8/2011 |
| CN | 104638083 | 5/2015 |
| CN | 107210338 | 9/2017 |

* cited by examiner

*Primary Examiner* — Tong-Ho Kim
(74) *Attorney, Agent, or Firm* — JCIPRNET

(57) ABSTRACT

A light emitting diode includes an N-type semiconductor layer, a P-type semiconductor layer, and a light emitting layer. The P-type semiconductor layer is located on the N-type semiconductor layer. The light emitting layer is located between the N-type semiconductor layer and the P-type semiconductor layer. The N-type semiconductor layer has a first region and a second region connected to each other. The first region is overlapped with the light emitting layer and the P-type semiconductor layer in a first direction. The second region is not overlapped with the light emitting layer and the P-type semiconductor layer in the first direction. A sheet resistance of the P-type semiconductor layer is smaller than a sheet resistance of the N-type semiconductor layer.

18 Claims, 4 Drawing Sheets

LIGHT EMITTING DIODE

CROSS REFERENCE TO RELATED APPLICATION

This application claims the priority benefit of Taiwan application serial no. 107121153, filed on Jun. 20, 2018. The entirety of the above-mentioned patent application is hereby incorporated by reference herein and made a part of specification.

BACKGROUND OF THE INVENTION

Technical Field

The disclosure relates to a light emitting device, and more particularly, to a light emitting diode (LED).

Description of Related Art

In general, an LED includes a P-type semiconductor layer, an N-type semiconductor layer, and a light emitting layer, wherein the light emitting layer is located between the P-type semiconductor layer and the N-type semiconductor layer. When a voltage is applied to the LED, electrons and holes are combined in the light emitting layer to emit light.

As technology advances, dimensions of the LED have been continuously decreased. Since a portion of the light emitting layer near the sidewall has relatively insufficient light emitting efficiency, if the LED is miniaturized, the area occupied by the portion of the light emitting layer with insufficient light emitting efficiency is increased, which reduces the overall light emitting efficiency of the LED.

SUMMARY

The disclosure provides an LED with improved light emitting efficiency.

In at least one embodiment, an LED that includes an N-type semiconductor layer, a P-type semiconductor layer, and a light emitting layer is provided. The P-type semiconductor layer is located on the N-type semiconductor layer. The light emitting layer is located between the N-type semiconductor layer and the P-type semiconductor layer. The N-type semiconductor layer has a first region and a second region connected to each other. The first region is overlapped with the light emitting layer and the P-type semiconductor layer in a first direction. The second region is not overlapped with the light emitting layer and the P-type semiconductor layer in the first direction. A sheet resistance of the P-type semiconductor layer is smaller than a sheet resistance of the N-type semiconductor layer.

In view of the above, according to at least one embodiment, the sheet resistance of the P-type semiconductor layer of the LED is adjusted to be smaller than the sheet resistance of the N-type semiconductor layer, so as to better resolve the issue of the unsatisfactory light emitting efficiency of the LED.

In order to make the aforementioned and other features and advantages provided in the disclosure more comprehensible, several embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles described herein.

DESCRIPTION OF THE EMBODIMENTS

Figure 1A:
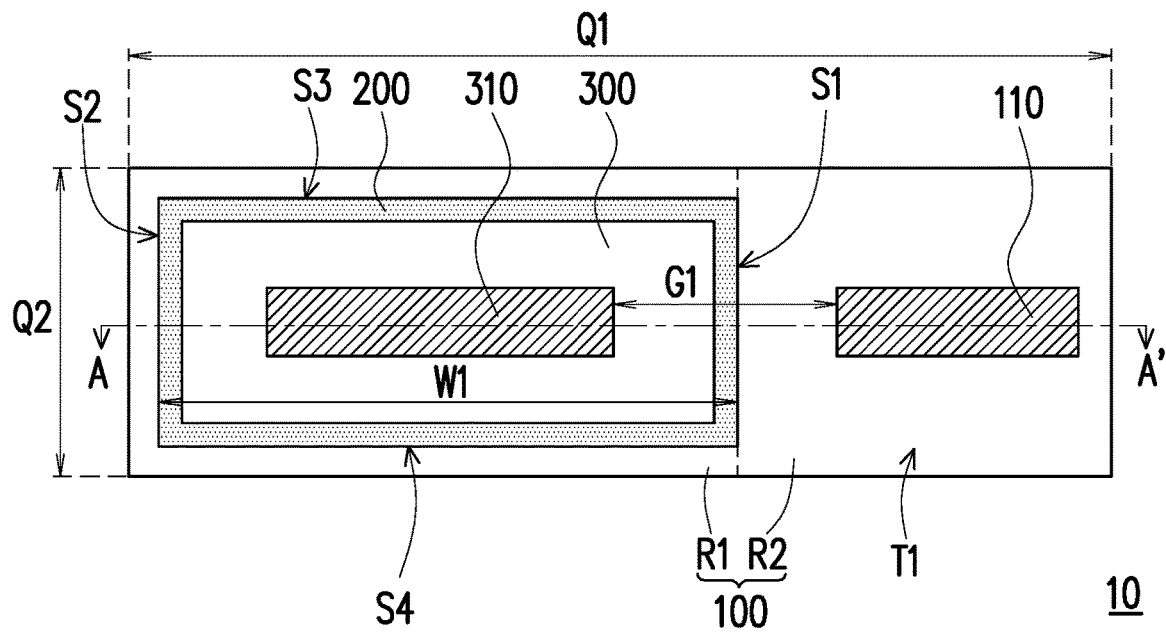
FIG. 1A is a schematic top view of an LED according to an embodiment of the invention.
Figure 1B:
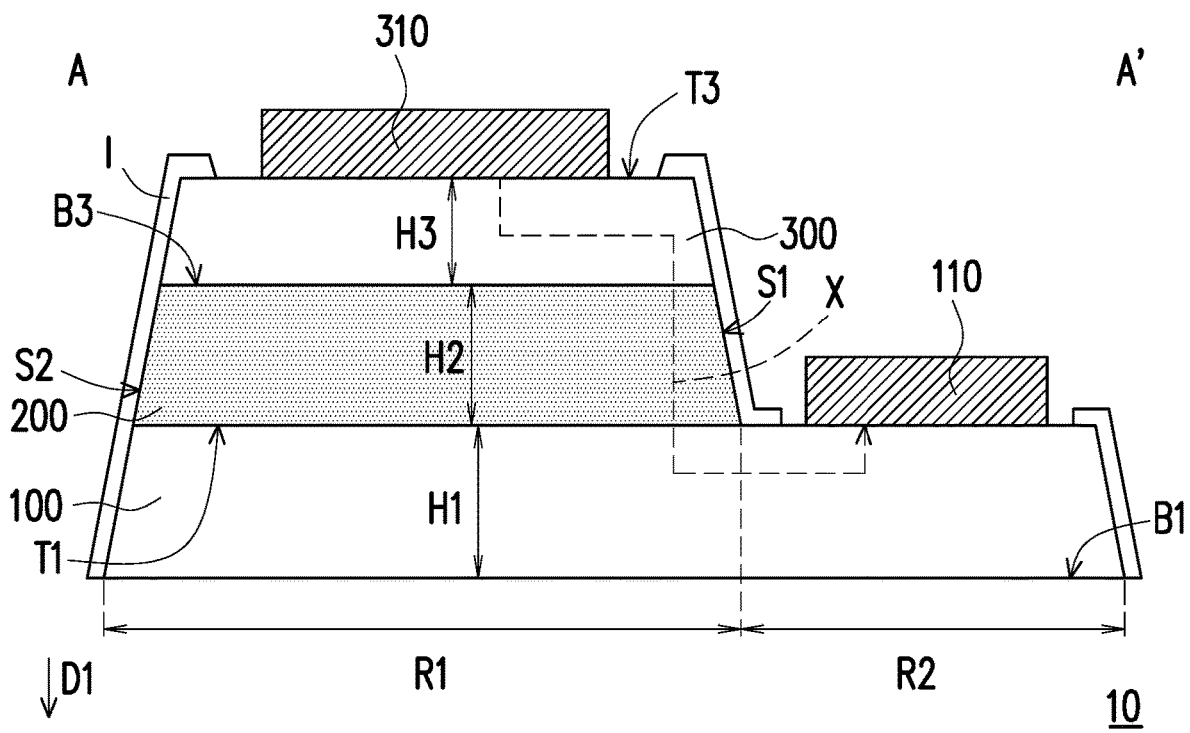
FIG. 1B is a cross-sectional view taken along a sectional line A-A' depicted in FIG. 1A.

FIG. 1A is a schematic top view of an LED according to an embodiment of the invention. FIG. 1B is a cross-sectional view taken along a sectional line A-A' depicted in FIG. 1A. To clearly explain the LED provided herein, an insulation layer I is omitted in FIG. 1A.

The LED 10 includes an N-type semiconductor layer 100, a P-type semiconductor layer 300, and a light emitting layer 200. The P-type semiconductor layer 300 is located on the N-type semiconductor layer 100. The light emitting layer 200 is located between the N-type semiconductor layer 100 and the P-type semiconductor layer 300. For instance, the N-type semiconductor layer 100 has a first surface T1 and a second surface B1 opposite to the first surface T1, and the light emitting layer 200 is disposed on a first surface T1. The P-type semiconductor layer 300 has a third surface T3 and a fourth surface B3 opposite to the third surface T3, and the fourth surface B3 is adjacent to the light emitting layer 200.

In some embodiments, a thickness H1 of the N-type semiconductor layer 100 is approximately 2 µm-4 µm. In some embodiments, a thickness H2 of the light emitting layer 200 is approximately 1 nm-200 nm. In some embodiments, a thickness H3 of the P-type semiconductor layer 300 is approximately 0.5 µm-1.5 µm.

In the present embodiment, the LED 10 is a lateral LED. The N-type semiconductor layer 100 has a first region R1 and a second region R2 connected to each other. The first region R1 is overlapped with the light emitting layer 200 and the P-type semiconductor layer 300 in a first direction D1 perpendicular to the first surface T1. In other words, the light emitting layer 200 and the P-type semiconductor layer 300 are sequentially formed above the first region R1 of the N-type semiconductor layer 100. Note that the sidewalls of the N-type semiconductor layer 100, the P-type semiconductor layer 300, and the light emitting layer 200 may be inclined surfaces; hence, a portion of the first region R1 may not be overlapped with the light emitting layer 200 and/or the P-type semiconductor layer 300 in the first direction D1. For instance, the leftmost inclined portion of the first region R1 shown in FIG. 1B is not overlapped with the light emitting layer 200 and the P-type semiconductor layer 300. In the present embodiment, the second region R2 is not overlapped with the light emitting layer 200 and the P-type semiconductor layer 300 in the first direction D1.

In some embodiments, the LED 10 may further include the insulation layer I. The insulation layer I covers a plurality of sidewalls of a stacked structure constituted by the N-type semiconductor layer 100, the light emitting layer 200, and the P-type semiconductor layer 300, partially covers the first surface T1 of the N-type semiconductor layer 100, and partially covers the third surface T3 of the P-type semiconductor layer 300, but the insulation layer I exposes or does not cover a portion of the first surface T1 (i.e., the upper surface of the second region R2) of the N-type semiconductor layer 100 and a portion of the third surface T3 of the P-type semiconductor layer 300.

In addition, in some embodiments, the LED 10 further includes a first electrode 110 and a second electrode 310. The first electrode 110 is electrically connected to the N-type semiconductor layer 100 and is disposed on the upper surface of the second region R2; namely, the first electrode 110 is disposed on a portion of the first surface T1 of the N-type semiconductor layer 100. The second electrode 310 is electrically connected to the P-type semiconductor layer 300. The second electrode 310 is disposed on the third surface T3 of the P-type semiconductor layer 300.

A resistance R of a rectangular semiconductor layer may be calculated by applying Equation 1:

$$R = (\rho/t) \times (L/W) \qquad \text{Equation 1}$$

In Equation 1, $\rho$ is the resistivity of the semiconductor layer, W represents a width of the semiconductor layer, L represents a length of the semiconductor layer, and t represents a thickness of the semiconductor layer, e.g., the thickness H1 of the N-type semiconductor layer 100 or the thickness H3 of the P-type semiconductor layer 300.

The sheet resistance $R_S$ of the semiconductor layer can be calculated by Equation 2

$$R_S = (\rho/t) \qquad \text{Equation 2}$$

In some embodiments, the width W of the semiconductor layer and the length L of the semiconductor layer are almost equal, and therefore the resistance R of the semiconductor layer is equal to the sheet resistance $R_S$ of the semiconductor layer.

According to the present embodiment, the sheet resistance of the P-type semiconductor layer 300 is smaller than the sheet resistance of the N-type semiconductor layer 100. When a voltage is applied to the LED 10, the current tends to flow in the P-type semiconductor layer 300 and passes through a portion of the light emitting layer 200 near the sidewall S1 of the light emitting layer 200, so as to shorten the flow path of the current in the N-type semiconductor layer 100 with the larger sheet resistance. For instance, the current tends to move along a path X. Hence, non-radiative sidewall recombination of electrons and holes near the sidewalls of the light emitting layer 200 (including the sidewall S2, a portion of the sidewall S3 near the sidewall S2, and a portion of the sidewall S4 near the sidewall S2) may be better prevented, so as to enhance the overall light emitting efficiency of the LED 10.

In some embodiments, a length Q1 of the LED 10 ranges from several micrometers to hundreds of micrometers, and so does the width Q2 of the LED 10. If the size of the LED 10 is relatively small, the proportion of the edge portion with low light emitting efficiency is relatively large; hence, the light emitting efficiency of the LED 10 may be significantly increased by adjusting the resistivity of the semiconductor layer.

Figure 2A:
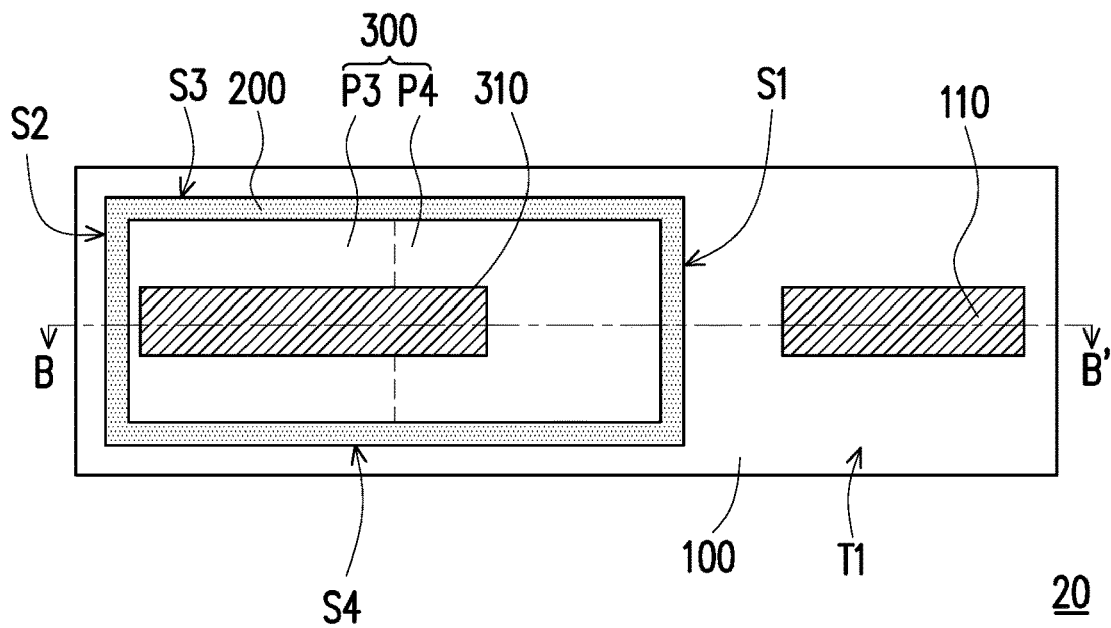
FIG. 2A is a schematic top view of an LED according to an embodiment of the invention.
Figure 2B:
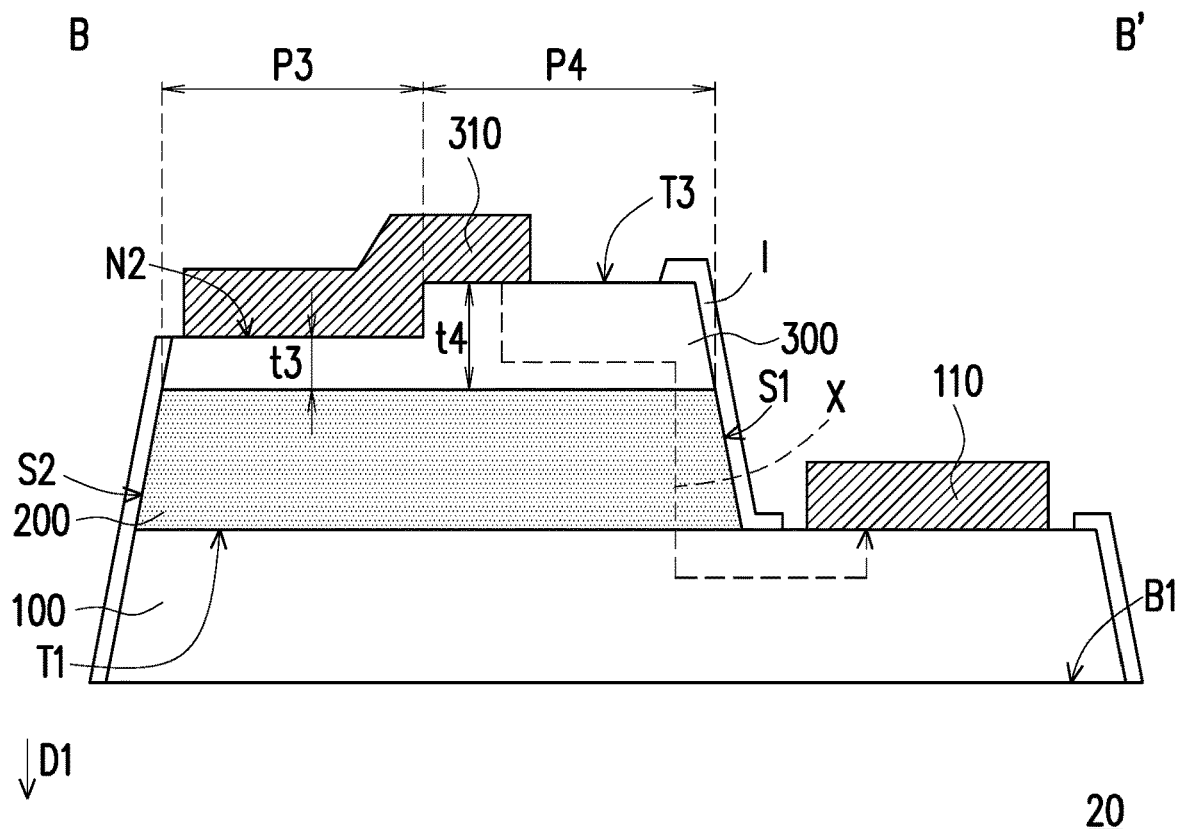
FIG. 2B is a cross-sectional view taken along a sectional line B-B' depicted in FIG. 2A.

FIG. 2A is a schematic cross-sectional view of the LED according to the first embodiment of the present invention. FIG. 2B is a cross-sectional view taken along a sectional line B-B' depicted in FIG. 2A. To clearly explain the LED provided herein, an insulation layer I is omitted in FIG. 2A. It should be noted that the reference numerals and a part of the contents in the previous embodiment depicted in FIG. 1A and FIG. 1B are used in the following embodiments depicted in FIG. 2A and FIG. 2B, in which identical reference numerals indicate identical or similar components, and repeated description of the same technical contents is omitted. For a detailed description of the omitted parts, reference can be found in the previous embodiment, and no repeated description is contained in the following embodiments.

A difference between the LED 20 depicted in FIG. 2B and the LED 10 depicted in FIG. 1B lies in that the P-type semiconductor layer 300 of the LED 20 has a corner notch N2 or has two different film thicknesses.

With reference to FIG. 2A and FIG. 2B, the P-type semiconductor layer 300 has a corner notch N2 adjacent to the sidewall or the side of the P-type semiconductor layer 300 farthest from the first electrode 110. In the present embodiment, the corner notch N2 is adjacent to the sidewall or the side of the P-type semiconductor layer 300 farthest from the first electrode 110, so that the P-type semiconductor layer 300 has a stepped shape with two different film thicknesses t3 and t4. For instance, the corner notch N1 is located at the side of the third surface T3 farthest from the first electrode 110. In the present embodiment, at least a part of the second electrode 310 is located in the corner notch N2.

In some embodiments, a method of forming the corner notch N2 includes inductively coupled plasma reactive ion etching, which should however not be construed as a limitation in the disclosure.

In the present embodiment, the P-type semiconductor layer 300 has a third portion P3 and a fourth portion P4 connected to each other. The third portion P3 is overlapped with the corner notch N2 in the first direction D1 and has a thickness t3, so as to prevent the light emitting efficiency from being affected by etching the light emitting layer 200 while the corner notch N2 is formed. The thickness t3 of the third portion P3 is smaller than the thickness t4 of the fourth portion P4. In a preferred embodiment, the thickness t3 is larger than 0 μm but is smaller than or equal to 85 percent of the thickness t4; more preferably, the thickness t3 is larger than 10 percent of the thickness t4 but is smaller than or equal to 80 percent of the thickness t4. Given the same material and the same doping concentration, it can be learned from Equation 2 that the smaller the thickness t of the semiconductor layer is, the larger the sheet resistance of the semiconductor layer is. Therefore, the sheet resistance of the third portion P3 is larger than the sheet resistance of the fourth portion P4. In the present embodiment, the sheet resistance of the N-type semiconductor layer 100 is larger than the sheet resistance of the third portion P3 and the sheet resistance of the fourth portion P4. The current may tend to flow through a portion of the light emitting layer 200 near the sidewall S1 of the light emitting layer 200, so as to shorten the flow path of the current in the third portion P3 and the N-type semiconductor layer 100. Thereby, non-radiative sidewall recombination of electrons and holes near the sidewalls of the light emitting layer 200 (including the sidewall S2, a portion of the sidewall S3 near the sidewall S2, and a portion of the sidewall S4 near the sidewall S2) may be better prevented, so as to enhance the overall light emitting efficiency of the LED 20. If the thickness t3 is larger than 10 percent of the thickness t4 but is smaller than or equal to 80 percent of the thickness t4, the above-mentioned effects may be achieved properly. The smaller the thickness t3 is, the greater the effects are. When the thickness t3 is larger than 10 percent of the thickness t4, it is possible to prevent the light emitting layer 200 from being etched, so as to improve the light emitting efficiency.

Figure 3A:
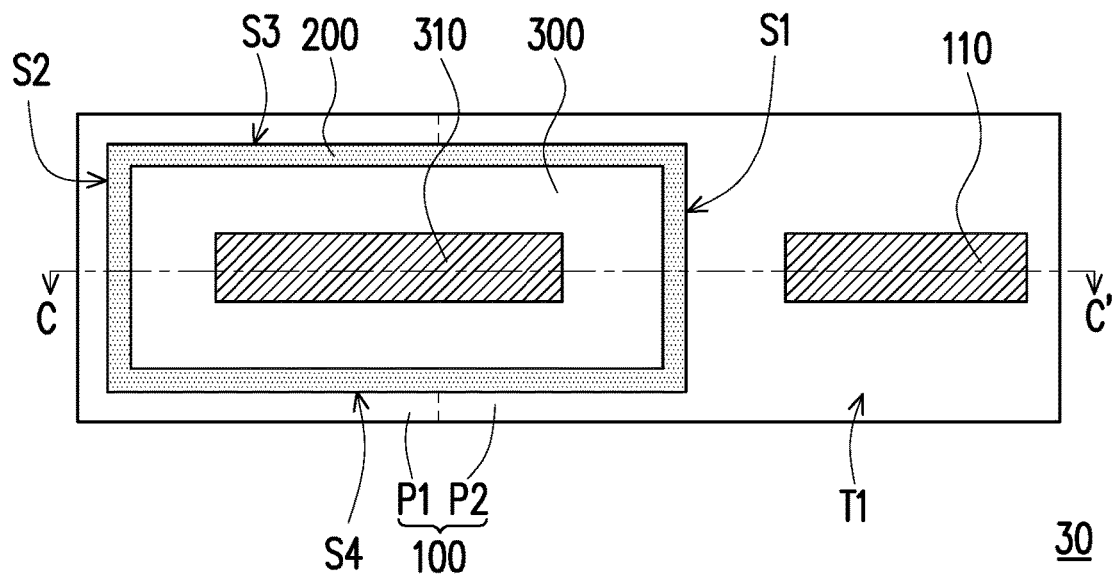
FIG. 3A is a schematic top view of an LED according to an embodiment of the invention.
Figure 3B:
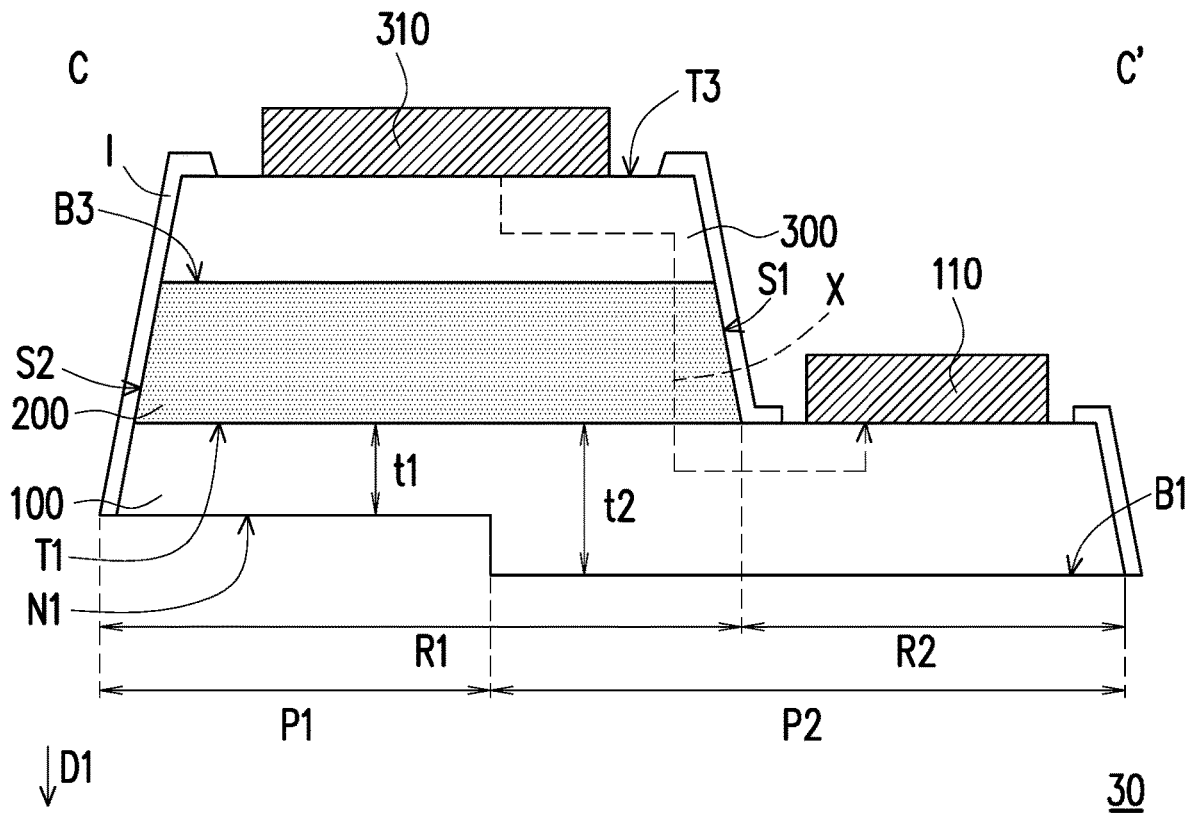
FIG. 3B is a cross-sectional view taken along a sectional line C-C' depicted in FIG. 3A.

FIG. 3A is a schematic top view of an LED according to an embodiment of the invention. FIG. 3B is a cross-sectional view taken along a sectional line C-C' depicted in FIG. 3A. To clearly explain the LED provided herein, an insulation layer I is omitted in FIG. 3A. It should be noted that the reference numerals and a part of the contents in the previous embodiment depicted in FIG. 1A and FIG. 1B are used in the following embodiments depicted in FIG. 3A and FIG. 3B, in which identical reference numerals indicate identical or similar components, and repeated description of the same technical contents is omitted. For a detailed description of the omitted parts, reference can be found in the previous embodiment, and no repeated description is contained in the following embodiments.

A difference between the LED 30 depicted in FIG. 3B and the LED 10 depicted in FIG. 1B lies in that the N-type semiconductor layer 100 of the LED 30 has a corner notch N1 or has two different film thicknesses.

With reference to FIG. 3A and FIG. 3B, in the present embodiment, the first region R1 of the N-type semiconductor layer 100 has the corner notch N1 adjacent to the sidewall or the side of the N-type semiconductor layer 100 farthest from the first electrode 110, so that the N-type semiconductor layer 100 has a stepped shape with two different film thicknesses t1 and t2. For instance, the corner notch N1 is located at the side of the second surface B1 farthest from the first electrode 110, i.e., at the side away from the second region R2.

In some embodiments, a method of forming the corner notch N1 includes inductively coupled plasma reactive ion etching, for instance, which should however not be construed as a limitation in the disclosure.

In the present embodiment, the N-type semiconductor layer 100 has a first portion P1 and a second portion P2 connected to each other. The first portion P1 is overlapped with the corner notch N1 in the first direction D1. A thickness t1 of the first portion P1 is smaller than a thickness t2 of the second portion P2. In a preferred embodiment, the thickness t1 is larger than 0 μm but is smaller than or equal to 85 percent of the thickness t2; more preferably, the thickness t1 is larger than 3 percent of the thickness t2 but is smaller than or equal to 80 percent of the thickness t2. Given the same material and the same doping concentration, it can be learned from Equation 2 that the smaller the thickness t of the semiconductor layer is, the larger the sheet resistance of the semiconductor layer is. Hence, the sheet resistance of the first portion P1 is larger than the sheet resistance of the second portion P2. Therefore, the current may tend to flow through a portion of the light emitting layer 200 near the sidewall S1 of the light emitting layer 200, so as to shorten the flow path of the current in the first portion P1. Thereby, non-radiative sidewall recombination of electrons and holes near the sidewalls of the light emitting layer 200 (including the sidewall S2, a portion of the sidewall S3 near the sidewall S2, and a portion of the sidewall S4 near the sidewall S2) may be better prevented, so as to enhance the overall light emitting efficiency of the LED 30. If the thickness t1 is larger than 3 percent of the thickness t2 but is smaller than or equal to 80 percent of the thickness t2, the above-mentioned effects may be achieved properly. The smaller the thickness t1 is, the greater the effects are. When the thickness t1 is larger than 3 percent of the thickness t2, it is possible to prevent the light emitting layer 200 from being etched, so as to improve the light emitting efficiency.

Figure 4A:
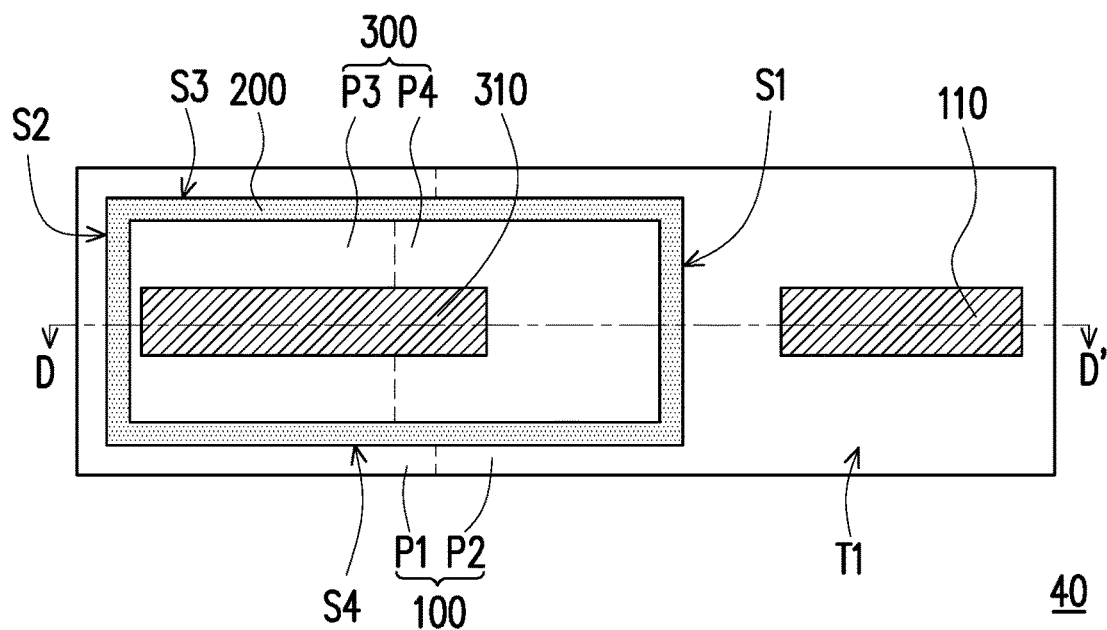
FIG. 4A is a schematic top view of an LED according to an embodiment of the invention.
Figure 4B:
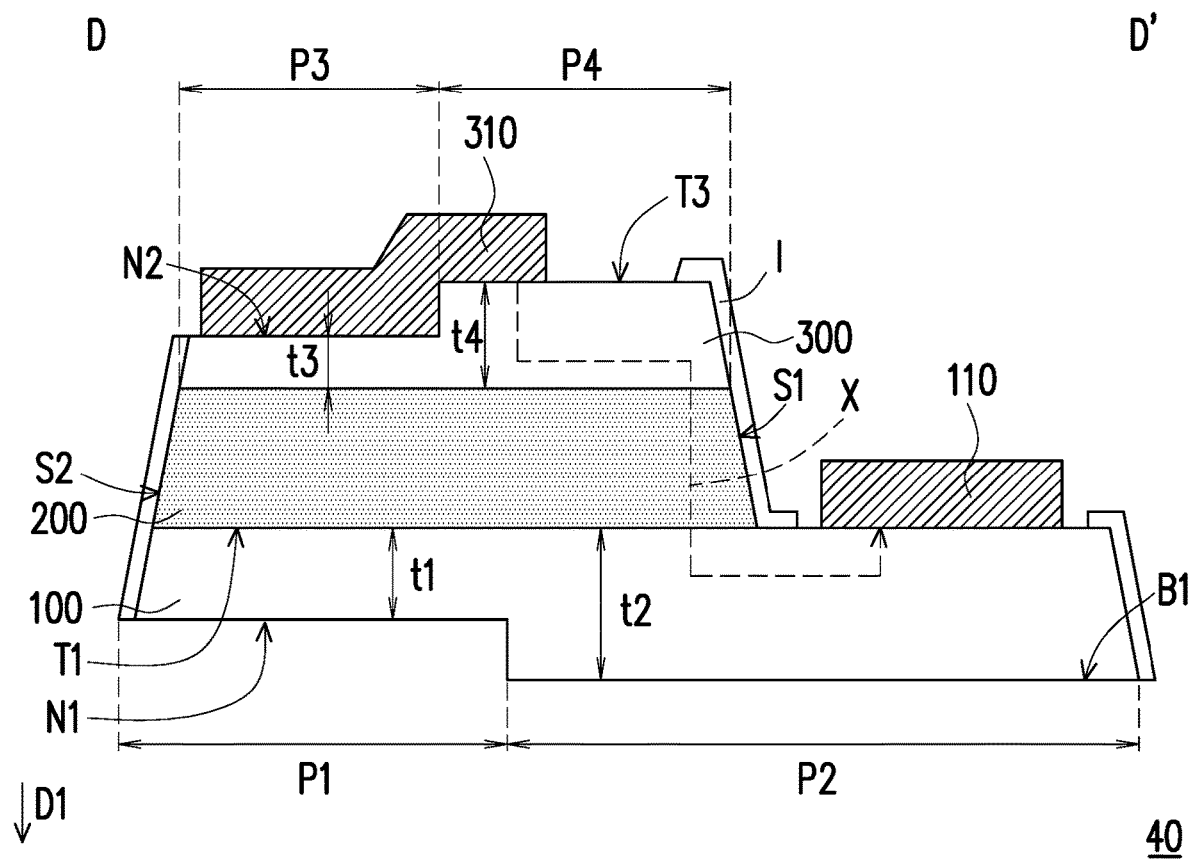
FIG. 4B is a cross-sectional view taken along a sectional line D-D' depicted in FIG. 4A.

FIG. 4A is a schematic top view of an LED according to an embodiment of the invention. FIG. 4B is a cross-sectional view taken along a sectional line D-D' depicted in FIG. 4A. To clearly explain the LED provided herein, an insulation layer I is omitted in FIG. 4A. It should be noted that the reference numerals and a part of the contents in the previous embodiment depicted in FIG. 2A and FIG. 3B are used in the following embodiments depicted in FIG. 4A and FIG. 4B, in which identical reference numerals indicate identical or similar components, and repeated description of the same technical contents is omitted. For a detailed description of the omitted parts, reference can be found in the previous embodiment, and no repeated description is contained in the following embodiments.

With reference to FIG. 4A and FIG. 4B, in the present embodiment, the LED 40 is equipped with both the corner notch N1 and the corner notch N2. The corner notch N1 and the corner notch N2 are overlapped in the first direction D1.

In some embodiments, the sheet resistance of the first portion P1 is larger than the sheet resistance of the third portion P3. In some embodiments, the sheet resistance of the second portion P2 is larger than the sheet resistance of the fourth portion P4. In some embodiments, the sheet resistance of the second portion P2 is larger than the sheet resistance of the third portion P3.

In the present embodiment, an area of the second portion P2 projected on the first surface T1 along the first direction D1 is greater than an area of the third portion P3 projected on the first surface T1 along the first direction D1 and an area of the fourth portion P4 projected on the first surface T1 along the first direction D1. The area of the fourth portion P4 projected on the first surface T1 along the first direction D1 and the area of the second portion P2 projected on the first surface T1 along the first direction D1 are overlapped. Thereby, the current may tend to flow through a portion of the light emitting layer 200 near the sidewall S1 of the light emitting layer 200, so that the LED 40 may have the large light emitting area and high light emitting efficiency. In some embodiments, the current density of the LED 40 is less than or equal to 3 A/cm$^2$.

In some embodiments, the area of the second electrode 310 is smaller than half the area of the light emitting layer 200, and the aforesaid area is, for instance, an orthogonal projection area on the first surface T1, as shown in each top view. In some embodiments, the shortest horizontal distance G1 from the second electrode 310 to the first electrode 110 is at least half a width W1 of the light emitting layer 200, as shown in FIG. 1A. Thereby, the current may flow efficiently in the LED 10, the LED 20, the LED 30, or the LED 40, so that the light emitting efficiency of the LED 10, the LED 20, the LED 30, or the LED 40 may be improved.

In some embodiments showing variations, the structures of the LED 10, the LED 20, the LED 30, and the LED 40 may be the same without departing from the scope of protection provided herein but may be turned upside down when they are applied. For instance, the LED 10, the LED 20, the LED 30, or the LED 40 may serve as a flip-chip LED. More specifically, the LED 10, the LED 20, the LED 30, or the LED 40 may be placed on a receiving substrate in an upright manner while the second surface B1 faces the receiving substrate or in an upside-down manner while the third surface T3 faces the receiving substrate.

In some embodiments, the resistivity of the semiconductor layer may be adjusted to control the sheet resistance of the semiconductor layer; for instance, the resistivity of the semiconductor layer may be adjusted through adjusting the material or the doping concentration of the semiconductor layer. In some embodiments, the P-type semiconductor layer 300 is made of gallium arsenide (GaAs), gallium nitride (GaN), indium gallium nitride (InGaN), or other appropriate materials, and the N-type semiconductor layer 100 is made of GaAs, GaN, InGaN, or other appropriate materials. The resistivity of the P-type semiconductor layer 300 is $\rho_p$, and the resistivity of the N-type semiconductor layer 100 is $\rho_n$, wherein $\rho_p \leq 0.75 \rho_n$. In some embodiments, the doping concentration of the P-type semiconductor layer 300 is at least 50 times the doping concentration of the N-type semiconductor layer 100. For instance, the P-type semiconductor layer 300 is made of GaAs with the doping concentration of $5 \times 10^{16}$ cm$^{-3}$, the N-type semiconductor layer 100 is made of GaAs with the doping concentration of $10^{15}$ cm$^{-3}$, the resistivity $\rho_p$ of the P-type semiconductor layer 300 is approximately 0.75 Ω·cm, and the resistivity $\rho_n$ of the N-type semiconductor layer 100 is approximately 1 Ω·cm. In some embodiments, a dopant of the P-type semiconductor layer 300 is magnesium, and a dopant of the N-type semiconductor layer 100 is silicon.

To sum up, according to at least one embodiment, the sheet resistance of the P-type semiconductor layer of the LED is adjusted to be smaller than the sheet resistance of the N-type semiconductor layer, so as to better resolve the issue of the unsatisfactory light emitting efficiency of the LED.

It will be apparent to those skilled in the art that various modifications and variations can be made to the structure provided in the disclosure without departing from the scope of protection. In view of the foregoing, it is intended that the disclosure cover modifications and variations of this invention provided they fall within the scope of the following claims and their equivalents.

What is claimed is:

1. A light emitting diode comprising:
   an N-type semiconductor layer;
   a P-type semiconductor layer located on the N-type semiconductor layer;
   a light emitting layer located between the P-type semiconductor layer and the N-type semiconductor layer, wherein the N-type semiconductor layer has a first region and a second region connected to each other, the first region is overlapped with the light emitting layer and the P-type semiconductor layer in a first direction, and the second region is not overlapped with the light emitting layer and the P-type semiconductor layer in the first direction, wherein a sheet resistance of the P-type semiconductor layer is smaller than a sheet resistance of the N-type semiconductor layer;
   a first electrode electrically connected to the N-type semiconductor layer and disposed in the second region; and
   a second electrode electrically connected to the P-type semiconductor layer;
   wherein at least one of the P-type semiconductor layer and the first region of the N-type semiconductor layer has a corner notch, and the corner notch is adjacent to a sidewall of at least one of the P-type semiconductor layer and the N-type semiconductor farthest from the first electrode.

2. The light emitting diode as recited in claim 1, wherein a thickness of the P-type semiconductor layer is 0.5 μm-1.5 μm, and a thickness of the N-type semiconductor layer is 2 μm-4 μm.

3. The light emitting diode as recited in claim 1, wherein the first region of the N-type semiconductor layer has the corner notch and has a first portion and a second portion connected to each other, the first portion is overlapped with the corner notch in the first direction, and a sheet resistance of the first portion is greater than a sheet resistance of the second portion.

4. The light emitting diode as recited in claim 1, wherein the first region of the N-type semiconductor layer has the corner notch and has a first portion and a second portion connected to each other, and the first portion has a first thickness smaller than a second thickness of the second portion.

5. The light emitting diode as recited in claim 4, wherein the first thickness is larger than 0 μm but smaller than or equal to 85 percent of the second thickness.

6. The light emitting diode as recited in claim 1, wherein the P-type semiconductor layer has the corner notch and has a third portion and a fourth portion connected to each other, the third portion is overlapped with the corner notch in the first direction, and a sheet resistance of the third portion is larger than a sheet resistance of the fourth portion.

7. The light emitting diode as recited in claim 1, wherein the P-type semiconductor layer has the corner notch and has a third portion and a fourth portion connected to each other, and the third portion has a third thickness smaller than a fourth thickness of the fourth portion.

8. The light emitting diode as recited in claim 7, wherein the third thickness is larger than 10 percent of the fourth thickness but smaller than or equal to 80 percent of the fourth thickness.

9. The light emitting diode as recited in claim 1, wherein a shortest horizontal distance from the second electrode to the first electrode is at least half a width of the light emitting layer.

10. The light emitting diode as recited in claim 1, wherein a resistivity of the P-type semiconductor layer is $\rho_p$, a resistivity of the N-type semiconductor layer is $\rho_n$, and $\rho_p \leq 0.75 \rho_n$.

11. The light emitting diode as recited in claim 10, wherein a doping concentration of the P-type semiconductor layer is at least 50 times a doping concentration of the N-type semiconductor layer.

12. A light emitting diode comprising:
   an N-type semiconductor layer;
   a P-type semiconductor layer located on the N-type semiconductor layer;
   a light emitting layer located between the P-type semiconductor layer and the N-type semiconductor layer, wherein the N-type semiconductor layer has a first region and a second region connected to each other, the first region is overlapped with the light emitting layer and the P-type semiconductor layer in a first direction, and the second region is not overlapped with the light emitting layer and the P-type semiconductor layer in the first direction, wherein a sheet resistance of the P-type semiconductor layer is smaller than a sheet resistance of the N-type semiconductor layer;
   a first electrode electrically connected to the N-type semiconductor layer and disposed in the second region; and
   a second electrode electrically connected to the P-type semiconductor layer;
   wherein the N-type semiconductor layer has a first surface adjacent to the light emitting layer and a second surface opposite to the first surface, the first region has a first corner notch, and the first corner notch is adjacent to a side of the second surface farthest from the first electrode.

13. The light emitting diode as recited in claim 12, wherein the P-type semiconductor layer has a third surface facing the light emitting layer and a fourth surface opposite to the first surface, the P-type semiconductor layer has a second corner notch, and the second corner notch is adjacent to a side of the fourth surface farthest from the first electrode.

14. The light emitting diode as recited in claim 13, wherein the first corner notch and the second corner notch are overlapped in the first direction.

15. The light emitting diode as recited in claim 13, wherein at least one portion of the second electrode is located in the second corner notch.

16. The light emitting diode as recited in claim 13, wherein the N-type semiconductor layer has a first portion and a second portion connected to each other, the first portion is overlapped with the first corner notch in the first direction, the P-type semiconductor layer has a third portion and a fourth portion connected to each other, the third portion is overlapped with the second corner notch in the first direction, and a sheet resistance of the first portion is larger than a sheet resistance of the third portion.

17. The light emitting diode as recited in claim 16, wherein a sheet resistance of the second portion is larger than a sheet resistance of the fourth portion.

18. The light emitting diode as recited in claim 16, wherein an area of the second portion projected on the first surface along the first direction is greater than an area of the first portion projected on the first surface along the first direction and an area of the fourth portion projected on the first surface along the first direction.

* * * * *